United States Patent [19]

Rümmler

[11] Patent Number: 4,577,118
[45] Date of Patent: Mar. 18, 1986

[54] DRIVING CIRCUIT FOR PULSE CURRENT POWER SUPPLIES

[75] Inventor: Jürgen Rümmler, Hamburg, Fed. Rep. of Germany

[73] Assignee: Deutsches Elektronen-Synchrotron Desy, Hamburg, Fed. Rep. of Germany

[21] Appl. No.: 630,530

[22] Filed: Jul. 13, 1984

[30] Foreign Application Priority Data

Jul. 15, 1983 [DE] Fed. Rep. of Germany ....... 3325502

[51] Int. Cl.⁴ ............................................. H03K 3/35
[52] U.S. Cl. .................................... 307/106; 307/419; 307/252 J; 328/67; 372/38
[58] Field of Search ............. 307/96, 106, 108, 252 J, 307/414, 415, 419, 421; 363/135; 328/67; 372/25, 38, 30

[56] References Cited

U.S. PATENT DOCUMENTS

| | | | |
|---|---|---|---|
| 2,912,602 | 11/1959 | Bownik, Jr. ..................... | 307/421 X |
| 3,134,048 | 5/1964 | Walfframm et al. ............. | 328/67 X |
| 3,914,648 | 10/1975 | Friedman et al. ................ | 372/38 X |
| 4,245,194 | 1/1981 | Fahlen et al. .................... | 372/38 X |

OTHER PUBLICATIONS

"Induction Heating Power Inverter" by Diehl, IBM Technical Disclosure vol. 20 No. 7, 12-1977.

Primary Examiner—A. D. Pellinen
Assistant Examiner—Derek S. Jennings
Attorney, Agent, or Firm—Cushman, Darby & Cushman

[57] ABSTRACT

A driving circuit for pulse current power supplies, particularly septum and kicker magnets for accelerators, with an inductance coil and a resonant circuit capacitor, has a thyratron, whose anode line is surrounded by a ring band core. A resistor and a second capacitor are connected in parallel to the thyratron. This arrangement permits operation of the thyratron at a higher forward voltage.

3 Claims, 4 Drawing Figures

DRIVING CIRCUIT FOR PULSE CURRENT POWER SUPPLIES

BACKGROUND OF THE INVENTION

The invention relates to a driving circuit for pulse current power supplies. Such circuits are, for example, used for operating kicker magnets, which are used in electron or proton accelerators (e.g., DESY Hamburg or Fermi National Accelerator Laboratory, Batavia, Chicago) for giving the rotating electron or proton bunches the desired direction for injection or ejection with respect to the accelerator ring. This is particularly necessary at injection and ejection points of the main orbit, because the deflecting in or out of an electron or proton cannot take place precisely tangentially due to the arrangement of the beam guidance magnets. Instead, it can only be done at a small residual angle of 2° to 4° relative to the orbit tangent. This small residual angle can afterwards be eliminated by triggering kicker magnets which may only be active if an electron or proton bunch is just passing through the injection kicker magnets. Since the electrons are on the orbit in accelerators rotating almost with the velocity of light and packed in individual, discrete bunches, it is absolutely necessary for the kicker magnet to be excited at precisely the right time, in order to give the electron bunches the desired direction. This has hitherto only been achieved in the aforementioned circuit by using a thyratron, e.g., of type CX1154 or CX1174 of English Elektric Valve Company Ltd. A disadvantage of the known circuit is that high backward cut-off voltages which appear at the thyratron quenching time and which are only permitted to a limited extent by the manufacturer, at the end of the current pulse greatly reduce the useful current range and the lifetime of the tube. Another disadvantage is that following the desired end of the pulse current, there are still free charge carriers in the thyratron, which initially make the quenching current drop negative and then go steeply towards zero. This charge removal leads to a rapid current break di/dt of approximately 2000 A/$\mu$s and therefore acts in the same way as a fast inductance coil disconnection, in which high, reverse-directed switching voltages are induced in the pulse current device. However, the cut-off voltages must not exceed a given maximum value, e.g., 10 kV for the first 25 $\mu$s following the anode pulse for the desired thyratron, e.g., of type CX1154 or CX1174, because otherwise the electrical current valve will be destroyed by flashovers and arc-backs. The same applies when thyristors are used, although their limit values are different.

Thus, as the known thyratrons cannot be exposed to higher breaking or cut-off voltages than 10 kV in the reverse direction, their anode voltage must also not exceed this value, so that in the known circuits the aforementioned thyratrons may only be operated with forward voltages at the anode of 9 kV, although maximum forward voltages of 40 kV would be admissible according to the manufacturer.

OBJECTS AND SUMMARY OF THE INVENTION

It is an object of this invention to improve the known circuit for pulse current devices in such a way that in actual operation the electrical current valve can be operated at a higher forward voltage than hitherto.

Briefly, in accordance with one embodiment of the invention, a driving circuit for pulse current power supplies has a first inductance coil as the load, the coil being connected via a first capacitor to a DC-power supply unit, preferably through a first resistor, with a controllable electric valve connected with its anode to the junction of the first capacitor and the power supply unit and with a recharging choke and recharging diode connected in parallel to the first capacitor. The circuit also comprises a ring band core which surrounds the line connecting the anode of the electrical valve and the junction of the first capacitor and the first resistor; and further comprises a second resistor and a second capacitor connected in series with the second resistor in such a way that one end of the second resistor is connected to the anode of the electrical valve and the other end thereof is connected to one end of the second capacitor, its other end being connected to ground.

Due to the use of one or more ring band cores having a rectangular hysteresis curve, until magnetic saturation of the ring band core is reached, there is a considerable voltage drop in the line section surrounded by the ring band core, which together with the second resistor connected in parallel to the current valve forms a voltage divider. In conjunction with the serially-connected second capacitor, this slows down the quenching current rise and consequently damps the quenching characteristics in the negative part of the valve characteristic. As a result, while respecting the limit value for the reverse voltage, a higher forward voltage can be applied to the current valve anode. However, a higher forward voltage also leads to a higher charge on the first capacitor and consequently to a higher current pulse, so that the circuit according to the invention can be operated with a smaller current valve, particularly a thyratron for the same pulse amplitude in the load inductance coil, e.g., in the kicker or septum magnet.

The same advantages are obtained when a thyristor is used as the current valve, although its limit values normally are different.

BRIEF DESCRIPTION OF THE DRAWINGS

The invention is described in greater detail hereinafter relative to the drawings, wherein.

DETAILED DESCRIPTION

Figure 1:
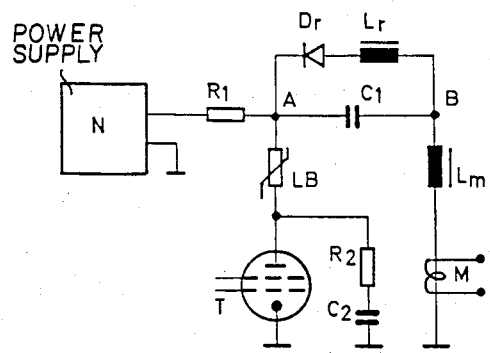
FIGS. 1 and 1a are diagrams of an embodiments of the circuit.

FIG. 1 shows a power supply unit N, which is connected to a load inductance coil Lm via a recharging first resistor R1 and a first capacitor C1. The load inductance coil Lm is, for example, a pulse magnet used in accelerators for the rapid orbit correction of particle bunches in an electron or proton accelerator system. The side of the load inductance coil Lm not connected to the first capacitor C1 is connected to ground as is the other pole of the power supply unit N. A current transformer M in practice surrounds the line section between load inductance coil Lm and ground, but is of no significance for the present invention.

A recharging choke Lr and a recharging diode Dr are connected in parallel to the first capacitor C1. The cathode of recharging diode Dr is connected between the recharging resistor R1 and the first capacitor C1 to a junction point A. The anode of recharging diode Dr is connected to one end of recharging choke Lr, whose other end is connected to a point B between first capacitor C1 and load inductance coil Lm. The first capacitor C1 and the recharging choke Lr form a slow resonant circuit for recharging the first capacitor C1 following the fast discharge of the first capacitor C1, which discharging takes place via a thyratron T connected to ground if the thyratron T is conducting.

The anode of the thyratron T is connected to junction point A, the line section between the thyratron anode and point A of the circuit being surrounded by the ring band core LB. The shape and operation of the ring band core LB will be described in greater detail relative to FIG. 2. A second resistor R2 and a second capacitor C2 are connected to ground in parallel to thyratron T. One end of resistor R2 is connected to the anode of the thyratron T and the other end of resistor R2 is connected to the second capacitor C2.

Figure 1A:
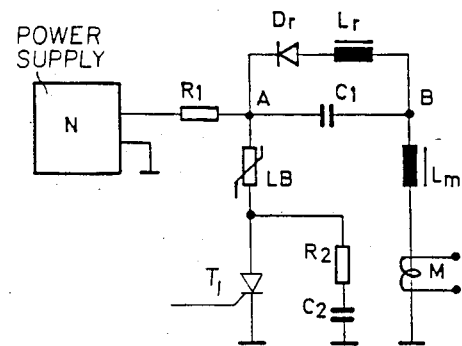

FIG. 1a shows the same elements as in FIG. 1 except the thyration T is replaced by thyristor T1. The basic operation of the FIG. 1a is the same as that of FIG. 1 and is not repeated.

Figure 2:
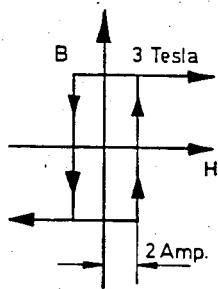
FIG. 2 is a hysteresis curve of a ring band core used in the circuit according to FIG. 1.

FIG. 2 shows the hysteresis curve for a ring band core LB usable according to the invention and which is, for example, made from high-quality Z-iron. A ring band core LB is a spirally wound soft iron strip, whose individual layers are insulated against one another. Its hysteresis curve is rectangular and it can be seen that, after reaching a given small saturation current of, e.g., 2 amperes, it passes abruptly into saturation B. Until saturation B is reached, the ring band core LB is remagnetized by the magnetic field H of the current flowing to the thyratron anode and consequently acts as an inductive reactance, which together with the resistor R2 forms a voltage divider. In conjunction with the second capacitor C2, this voltage divider forms an RC-network, which damps high frequency oscillations during the breaking process. Up to saturation, a ring band core LB acts like a high inductance while, after saturation, it is electrically ineffective. The charging current for the second capacitor C2 drives the ring band core LB into saturation, the effective pulse for pulse current having the same direction as the charging current. The effective pulse does not change the saturation state of the ring band core LB and the pulsating current is not impaired. Since a high current flows within a few nanoseconds while the thyratron T is conducting, the ring band core LB is already in saturation due to the previously applied charge current and consequently has no influence on the pulse shape. However, after the thyratron T has been cut off, only a very small recharging current flows, which reverses the polarity of ring band core LB, removes it from saturation and thus forces the ring band core LB to become a high inductance again.

Figure 3:
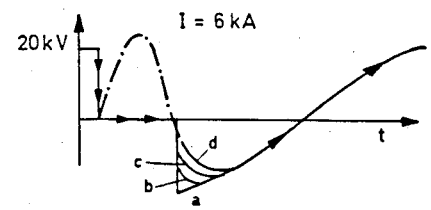
FIG. 3 is a current and voltage diagram obtainable with the circuit according to FIG. 1.

FIG. 3 shows this by means of a current and voltage diagram, the cut-off voltage being shown as a continuous curve, while the current pulse for the magnet Lm is indicated by a dot-dash line.

Curve a represents a high cut-off voltage in the case of only RC-wiring of thyratron T, but without a ring band core LB. Curve b shows the influence of the ring band core LB according to the invention which damps the quenching characteristic at thyratron T. Curves c and d show more favorable characteristics resulting from higher R2, C2 and LB-values.

It is to be noted that one or more ring band cores LB can be used depending on the overall dimensions and characteristics of the circuit.

What is claimed is:

1. A driving circuit for pulse current power supplies with a first inductance coil as the load, said first inductance coil being connected via a first capacitor to a DC-power supply unit, with a controllable electric valve connected with its anode to a junction (A) of the first capacitor with the power supply unit, and with a recharging choke and a recharging diode connected in parallel to the first capacitor, said driving circuit comprising:

at least one ring band core surrounding the line connecting junction (A) with the anode of the electrical valve;

and further comprising a resistor and a second capacitor connected in series with said resistor so that one side of said resistor is connected to the anode of the electrical valve and the other side of the resistor is connected to the second capacitor, the other side of the second capacitor being connected to ground.

2. A driving circuit according to claim 1, wherein the electric valve is a thyratron.

3. A driving circuit according to claim 1, wherein the electric valve is a thyristor.

* * * * *